(12) United States Patent
Lee et al.

(10) Patent No.: US 11,728,791 B2
(45) Date of Patent: Aug. 15, 2023

(54) SWITCH CONTROL CIRCUIT AND SWITCH CONTROL METHOD THEREOF

(71) Applicant: Magnachip Semiconductor, Ltd., Cheongju-si (KR)

(72) Inventors: Jang Hyuck Lee, Seongnam-si (KR); Joo Han Yoon, Seongnam-si (KR); Byoung Kwon An, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 17/730,778

(22) Filed: Apr. 27, 2022

(65) Prior Publication Data

US 2023/0016211 A1 Jan. 19, 2023

(30) Foreign Application Priority Data

Jul. 19, 2021 (KR) .................. 10-2021-0094272

(51) Int. Cl.
*H03K 3/012* (2006.01)
*H03K 17/687* (2006.01)
*H02M 1/08* (2006.01)
*H05B 45/375* (2020.01)
*H02M 3/00* (2006.01)

(52) U.S. Cl.
CPC ............ *H03K 3/012* (2013.01); *H02M 1/083* (2013.01); *H03K 17/687* (2013.01); *H05B 45/375* (2020.01); *H02M 3/01* (2021.05)

(58) Field of Classification Search
None
See application file for complete search history.

(56) References Cited

U.S. PATENT DOCUMENTS 9,088,218 B2 * 7/2015 Zhang ............... H02M 3/33515
9,502,975 B2 11/2016 Shin et al.

FOREIGN PATENT DOCUMENTS

KR 10-2015-0106044 A 9/2015

* cited by examiner

*Primary Examiner* — Kenneth B Wells
(74) *Attorney, Agent, or Firm* — NSIP Law

(57) ABSTRACT

A switch control circuit and a switch control method are provided. The switch control circuit includes a load, an inductor, a control switch, and a sensing resistance connected in series to an input power source; an integrator that integrates a sensing voltage and a load current setting voltage to generate an integrated signal; a comparator that compares the integrated signal and a bias voltage; a switch driver that controls the control switch based on an output of the comparator and an output of an off time controller; and a gate sensor that outputs, to the integrator, a gate sensing signal that senses a time when an input of a gate terminal of the control switch becomes a low level. An integration operation is started from a position in which the integrated signal is located lower than the bias voltage, when an input of the gate terminal becomes a high level.

20 Claims, 9 Drawing Sheets

SWITCH CONTROL CIRCUIT AND SWITCH CONTROL METHOD THEREOF

CROSS-REFERENCE TO RELATED APPLICATIONS

This application claims the benefit under 35 U.S.C. § 119 to Korean Patent Application No. 10-2021-0094272, filed on Jul. 19, 2021, in the Korean Intellectual Property Office, the entire disclosure of which is incorporated herein by reference for all purposes.

BACKGROUND

1. Field

The following description relates to a switch control circuit and switch control method thereof.

2. Description of Related Art

A switch control circuit may be composed of a control switch that controls a current flowing to a load (for example, a Light Emitting Diode (LED) device), a sensing circuit that senses a load current, a control circuit that controls a control switch based on a load current, etc. An example of the switch control circuit is illustrated in FIG. 1.

FIG. 1 illustrates a typical switch control circuit that operates in a Continuous Conduction Mode (CCM) peak mode, and FIG. 2 illustrates an operation timing diagram of FIG. 1. Ideally, in an operation of the switch control circuit of FIG. 2, a control switch should be turned off when a VCS voltage and an ADIM voltage (target) become equal to each other. The VCS voltage refers to a voltage at opposite sides of a sensing resistance (RCS) connected to a control switch (or a voltage at a CS terminal) in FIG. 1, and an ADIM voltage refers to a voltage that is set to control an LED device of a load.

However, practically, by a propagation delay that occurs between an output terminal (OUT) of a comparator and a gate terminal (GATE) in FIG. 1, a VCS voltage may exceed an ADIM voltage, similar to the illustration in FIG. 2, so a timing to turn off a control switch becomes slower by as much as ΔVCS. Accordingly, like in FIG. 2, a gate-on timing becomes longer by as much as t1~t2 section (t4~t5 section), and an inductor current is also increased. Therefore, an LED current of a load may exceed a value that is initially set up, resulting in an error.

To remove the increased amount of inductor current, a method as illustrated in FIG. 3 has been proposed. FIG. 3 illustrates a switch control circuit that operates in a CCM average mode, and FIG. 4 illustrates a timing diagram of FIG. 3. Unlike a method that compares a VCS voltage and an ADIM voltage as illustrated in FIG. 1, by creating a 'HALF ADIM voltage', which is half of an ADIM voltage, FIG. 3 compares an integrated value (Bias) of the HALF ADIM voltage and an integrated value (integrated signal) of the VCS voltage, and hereat, 'HALF ADIM voltage' signal is created by an integrator that receives an ADIM voltage.

With reference to FIG. 4, which is a timing diagram of FIG. 3, a HALF ADIM voltage and a VCS voltage are integrated by an integrator. A comparator outputs an OUT signal of a high level when a bias voltage (Bias), which is the integrated value, and an integrated signal becomes identical (t2, t6). Accordingly, a control switch is turned off. Additionally, a switch control circuit of FIG. 3 may include an off-time controller that counts an off time from a time when a control switch is turned off, or an output of the comparator is a high level. The off-time controller may turn on a control switch when a predetermined off-time has passed, and a user may set the off-time by a certain program or an external output through an RT-OFF (TOFF) terminal.

However, propagation delay may still exist in this method that occurs between an output terminal of a comparator and a gate terminal, and consequently, a turn-off timing of a control switch may be delayed by as much as t2~t3 (t6~t7). Therefore, the method may not solve the issue of increased inductor current.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a switch control circuit, including a load, an inductor, a control switch, and a sensing resistance connected in series to an input power source; an integrator configured to integrate a sensing voltage (VCS) and a load current setting voltage (ADIM) to generate an integrated signal; a comparator configured to compare the integrated signal and a bias voltage (Bias); a switch driver configured to control the control switch based on an output of the comparator and an output of an off time controller; and a gate sensor configured to output, to the integrator, a gate sensing signal that senses a time when an input of a gate terminal of the control switch becomes a low level, wherein an integration operation is started from a point in time when the integrated signal is lower than the bias voltage and when an input of the gate terminal becomes a high level.

The integrator may include a current source, configured to provide a current based on a difference between a reference voltage ($V_{REF}$) and the sensing voltage (VCS); a first switch, a capacitor, a bias that is a voltage source, electrically connected to the current source; a logic element electrically connected to the first switch; and a second switch, connected on opposite sides of the capacitor, and configured to receive an output signal of a switch control logic unit.

The reference voltage ($V_{REF}$) may be a half voltage of the load current setting voltage (ADIM).

The logic element may be an SR latch, wherein an 'S' terminal of the SR latch may be configured to receive an output signal of the off-time controller, an 'R' terminal of the SR latch may be configured to receive an output signal of the gate sensor, and a 'Q' terminal of the SR latch may be configured to output an output signal to the first switch.

The switch control logic unit may include an inverting buffer.

The integrated signal may decrease until an input of the gate terminal becomes a low level, from a timing when the integrated signal is identical to the bias voltage, and the decrease of the integrated signal may be stopped when the gate sensor outputs a gate sensing signal to the integrator.

A decreased value of the integrated signal may be lower than the bias voltage, and the integrated signal is maintained until an input of the gate terminal becomes a high level.

The integrated load current setting voltage may be an integration of a half voltage of the load current setting voltage (HALF ADIM).

The switch control circuit may be configured to operate in one of a Continuous Conduction Mode (CCM) and a Boundary Conduction Mode (BCM).

The switch control circuit that operates in the BCM mode may be a Quasi-Resonant (QR) buck-converter.

The Quasi-Resonant buck-converter may include a Zero-Current-Detect Circuit (ZCD Circuit) configured to detect a timing when an inductor current becomes 0.

The Zero-Current-Detect Circuit (ZCD Circuit) may include one capacitor and two resistances which are connected in series.

In a general aspect, a switch control method of a switch control circuit includes comparing an integrated signal that integrates a sensing voltage and a bias voltage; decreasing an integrated signal below the bias voltage in a decreasing portion of the integrated signal; stopping a decrease of the integrated signal and maintaining the integrated signal for a predetermined time; and starting an integration operation of the sensing voltage when it is lower than the bias voltage and when an input of a gate terminal becomes a high level.

The switch control circuit may be configured to operate in one of a Continuous Conduction Mode (CCM mode) and a Boundary Conduction Mode (BCM mode).

The integrated signal may be decreased starting from a point in time when an output of the comparing is a high level, until an input of the gate terminal becomes a low level.

The decrease of the integrated signal may be stopped when a gate sensing signal is output to indicate that an input of the gate terminal is a low level.

A decreased value of the integrated signal may be maintained until an input of the gate terminal becomes a high level again.

In a general aspect, a switch control circuit includes a load, an inductor, a control switch, and a sensing resistance connected in series with an input power source; and a switch controller configured to control an operation of the control switch, wherein the switch controller includes: an integrator configured to receive a current measured by the sensing resistance and a reference current, and generate an integrated signal; an amplifier configured to compare the integrated signal and a bias voltage; an off time controller configured to create a control signal to turn on the control switch after a predetermined time period, and an SR latch configured to control the control switch based on an output of the amplifier and an output of the off time controller, and a gate sensor configured to transmit a gate sensing signal to the integrator.

The integrated signal may be generated during a period when the control switch is turned on.

The gate sensor may be further configured to sense a time when an input of a gate terminal becomes a low level, and transmit a result of the sensing to the integrator.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
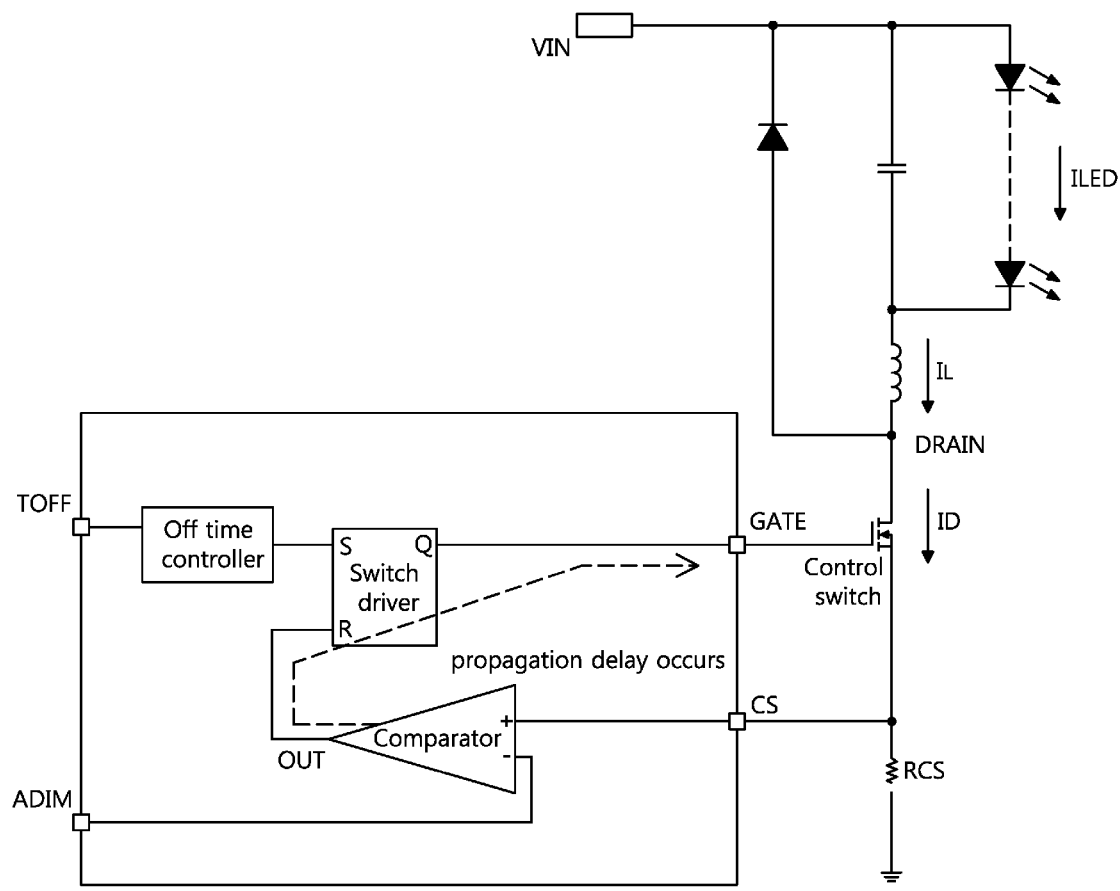
FIG. 1 illustrates a typical switch control circuit diagram operated in a CCM peak mode.
Figure 2:
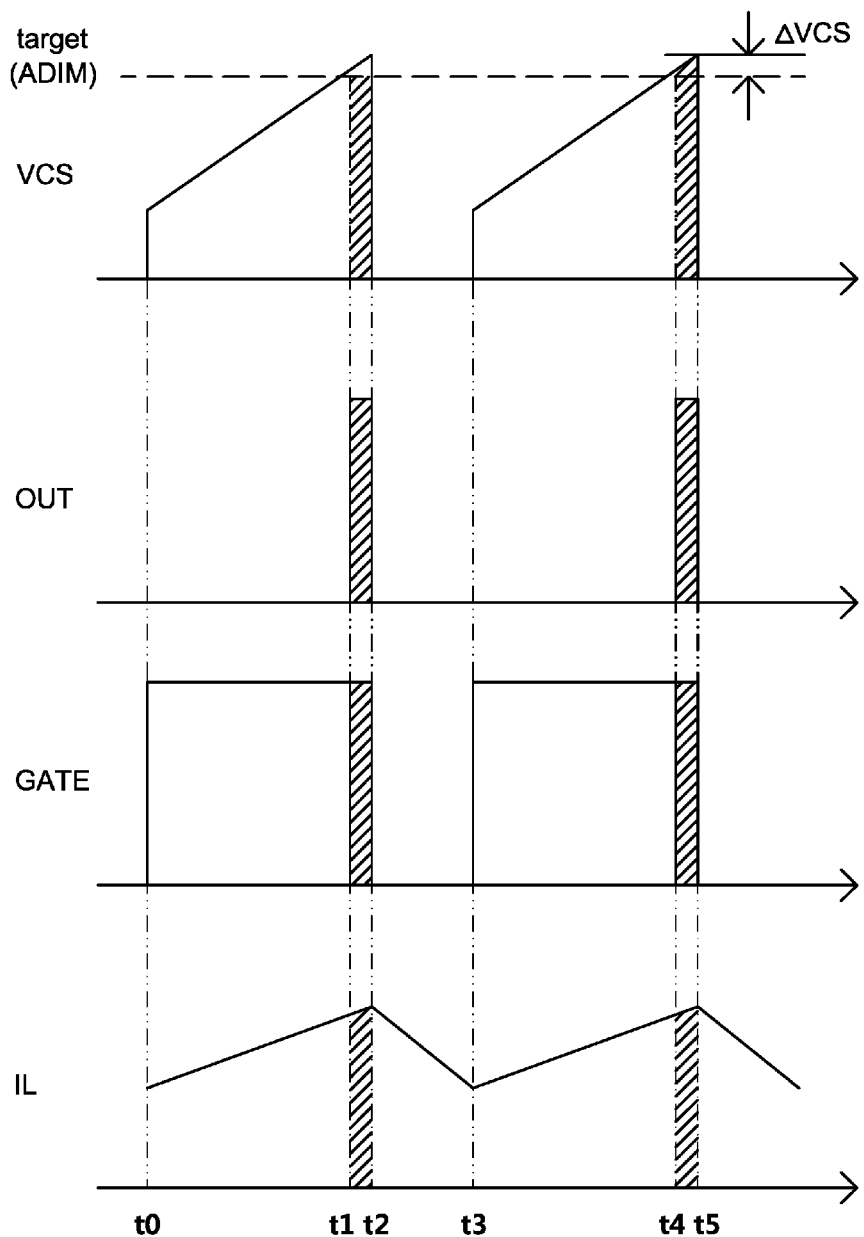
FIG. 2 illustrates an operation timing diagram of FIG. 1.
Figure 3:
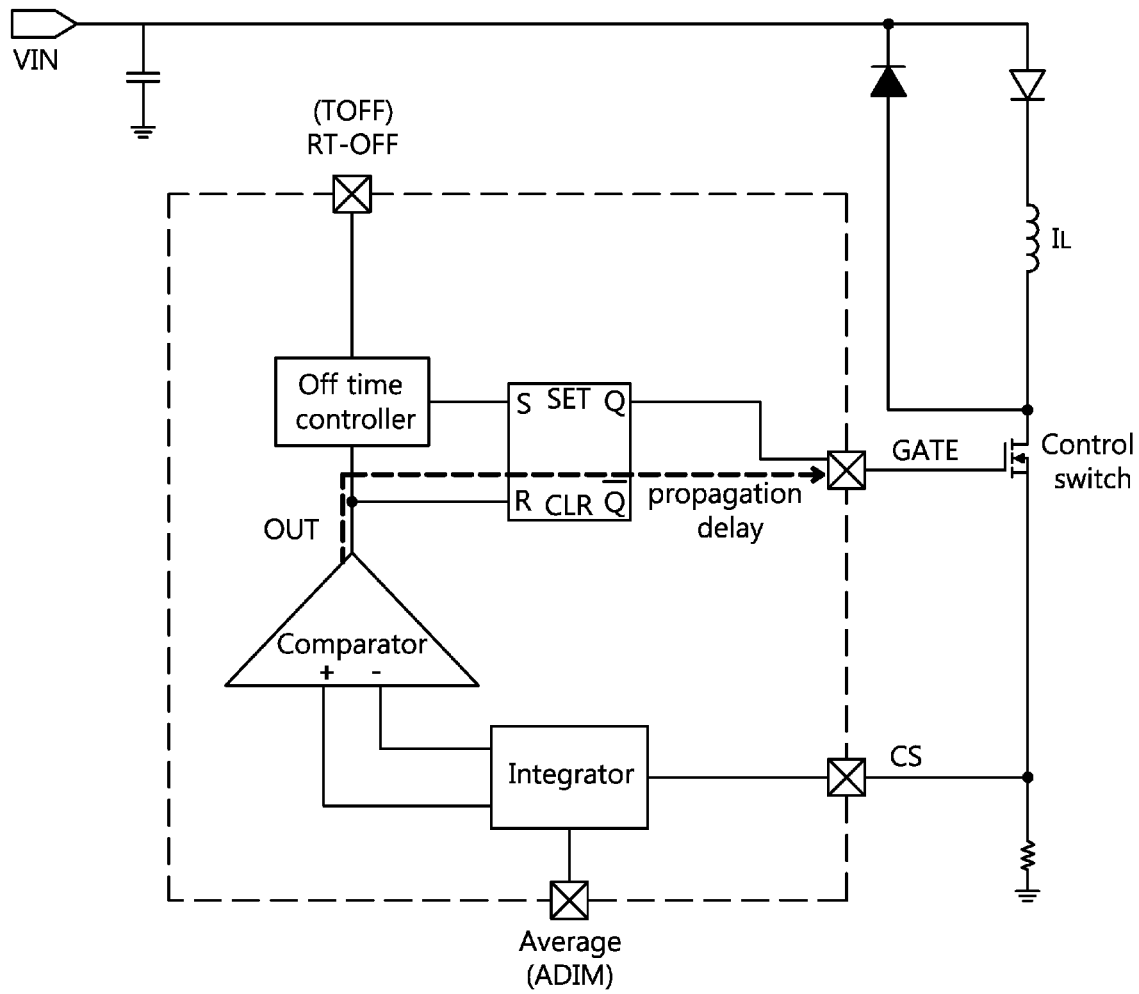
FIG. 3 illustrates a typical switch control circuit diagram operated in a CCM average mode.
Figure 4:
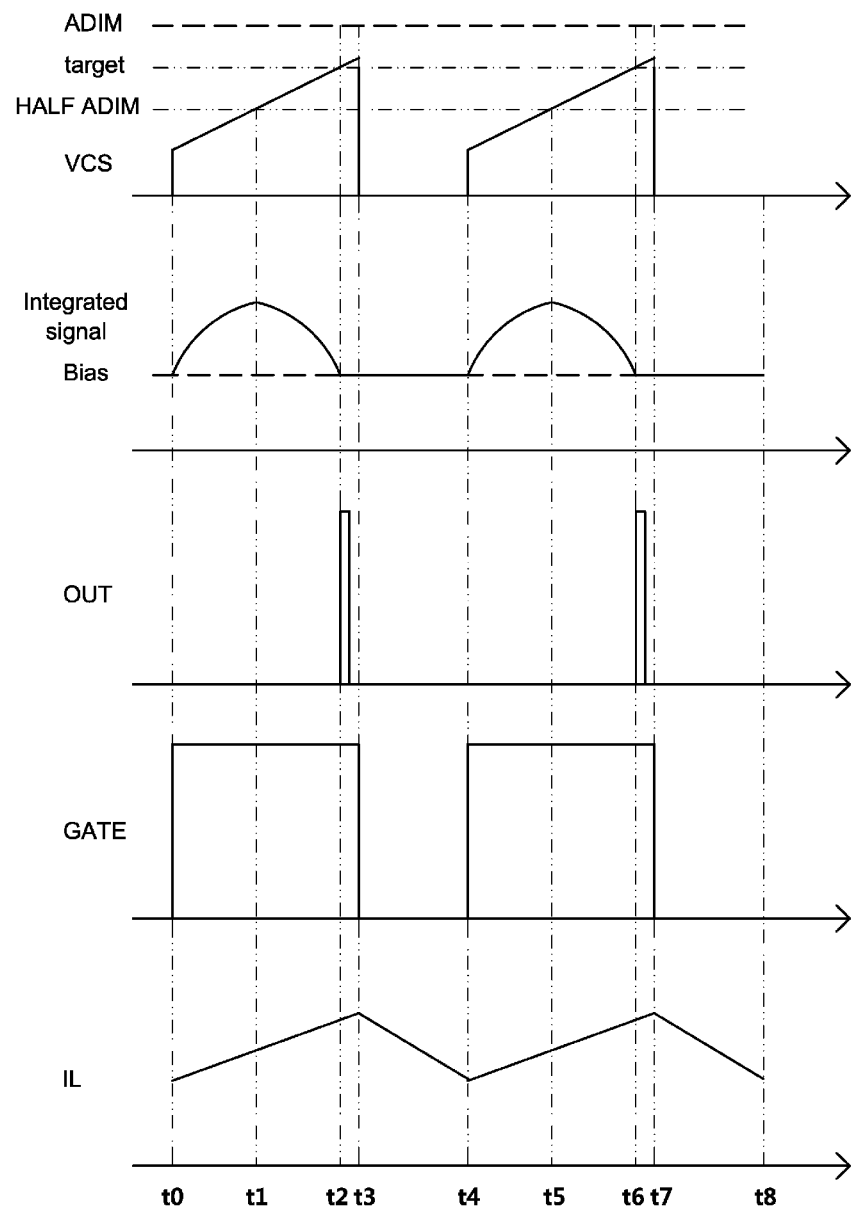
FIG. 4 illustrates an operation timing diagram of FIG. 3.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A targeted problem of the disclosure is not limited by the problems which are mentioned above, and other problems may be understood by a person skilled in the relevant field of technology, from the following description.

The disclosure may solve the problems above, providing a switch control circuit and a switch control method to compensate an error of a load current that may occur by a propagation delay.

The one or more examples relate to a switch control circuit and switch control method thereof to compensate an error of a current flowing to a load of a switch control circuit.

A detailed description of the one or more examples is given below, based on examples illustrated in the drawings.

In one or more examples, a switch control circuit may be applied for all switch control circuits operated in a Continuous Conduction Mode (CCM mode) or a Boundary Conduction Mode (BCM mode). A difference is that a starting point to increase an inductor current may be different, a CCM mode and a BCM mode have a circuit composition to control an off time, and an off-time controller in a BCM mode is operated by inputting an output of a zero-current-detect circuit (ZCD circuit), which are all described below.

Figure 5:
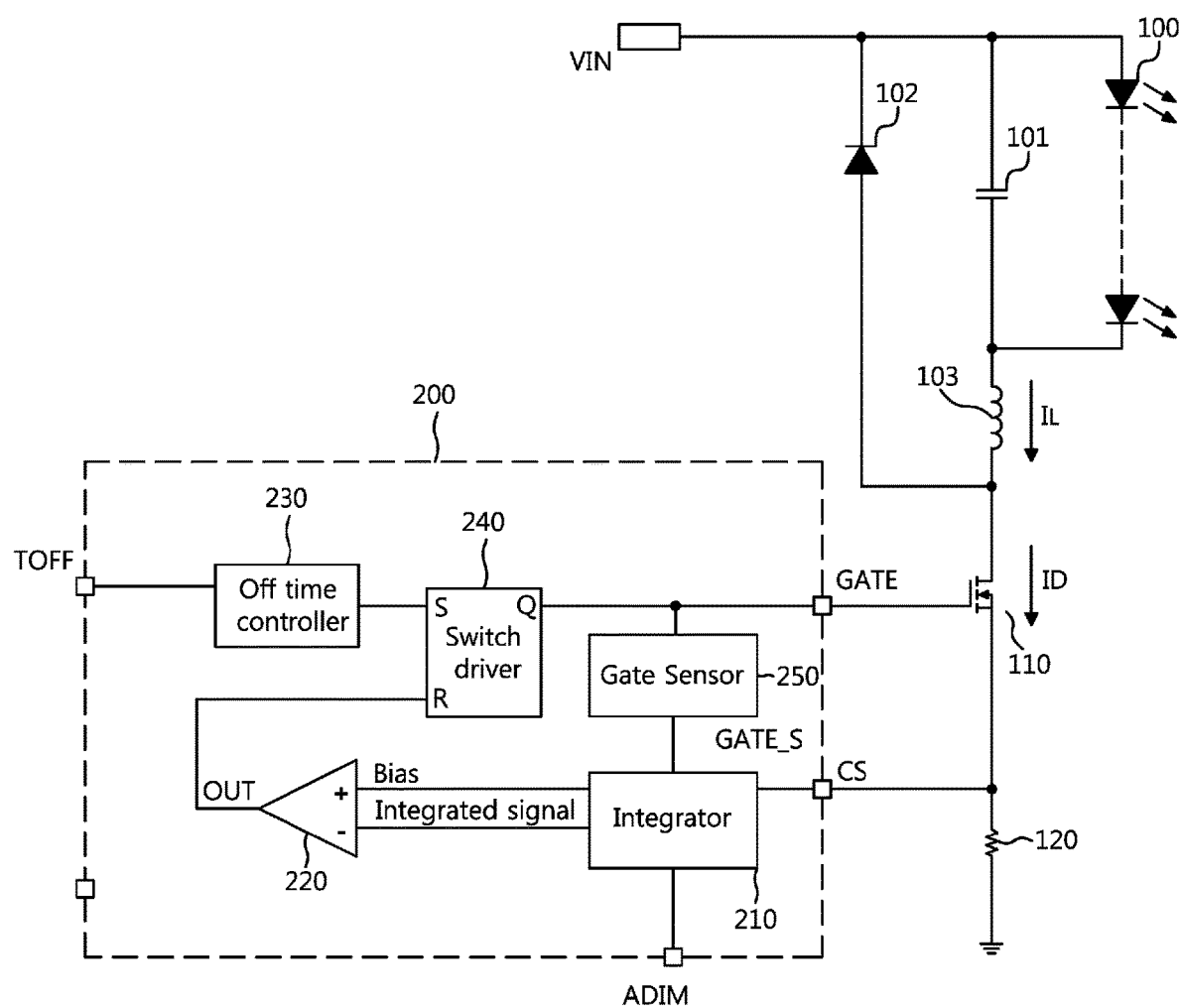
FIG. 5 illustrates an example switch control circuit diagram that operates in a CCM mode, in accordance with one or more embodiments.

FIG. 5 illustrates an example switch control circuit diagram that operates in a CCM mode, in accordance with one or more embodiments.

Referring to FIG. 5, one or more light-emitting devices 100 are connected in series with an input voltage terminal (VIN). Additionally, a capacitor 101 that is connected in parallel with the one or more light-emitting devices 100, a diode 102 that communicates a current input in the one or more light-emitting devices 100 and the capacitor 101, and an inductor 103, that is connected in series with the one or more light-emitting device 100s and the capacitor 101, may be included. A control switch (MOSFET, 110) and a sensing resistance 120 may be connected between the inductor 103 and a ground.

An inductor 103 may be implemented to save energy that is supplied through an input power source according to an operation of the control switch 110, or release saved energy. The inductor 103 may induce a voltage in proportion to a changed amount of a current flowing to the inductor 103, suppress a rapid change of a current, and save an energy in proportion to a square of an amount of a flowing current. As a capacity of the inductor 103 is changed, a turn-on and turn-off cycle of the control switch 110 may be changed to correspond to it. Accordingly, an operation frequency of a control switch 110 may be changed so as to correspond to the capacity of the inductor 103.

In an example, the diode 102 may be a freewheeling diode, and it may form a current movement loop that may be able to provide an energy to a load (for example, the one or more light-emitting devices 100), when the energy is released from the inductor 103.

In an example, the control switch 110 may be connected in series with the inductor 103, and may control an amount of a current flowing to the one or more light-emitting devices 100, by repeatedly performing turn-on and turn-off operations.

The sensing resistance 120 may be connected between one end of the control switch 110 and a reference potential. Based on a voltage at opposite sides of the sensing resistance 120 (or a voltage at a CS terminal), a current flowing to the one or more light-emitting devices 100 may be measured.

According to FIG. 5, a switch controller 200 that controls an operation of the control switch 110 may be implemented. The switch controller 200 may include an integrator 210, a comparator 220, an off-time controller 230, a switch driver 240, and a gate sensor 250.

In an example, the integrator 210 may receive a current measured by the sensing resistance 120 and a predetermined reference current, and respectively perform an integration operation for the two received currents. A reference current may be set in a manufacturing operation, or it may be changed through a certain program or a pin that is installed outside of the integrator 210. The integrator 210 may perform an integration operation during a period when the control switch 110 is turned on, and it may be reset when the control switch 110 is turned off. An inner circuit composition of the integrator 210 is illustrated in FIG. 6.

Figure 6:
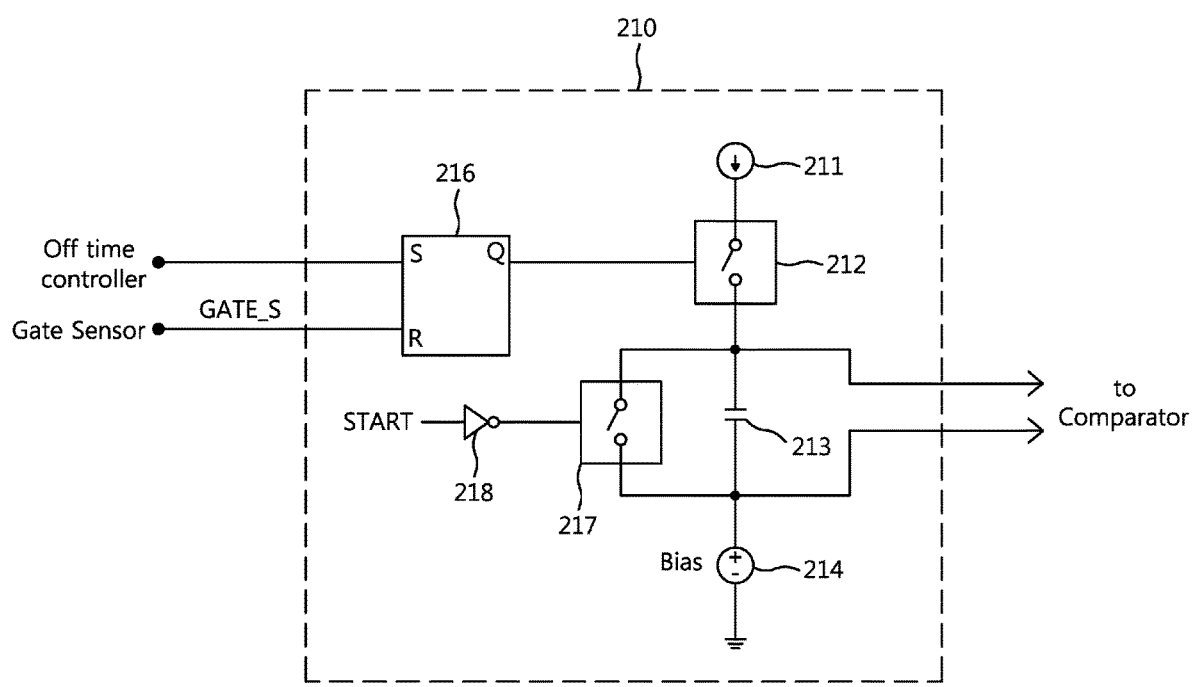
FIG. 6 illustrates an inner circuit diagram of the integrator of FIG. 5.

Referring to FIG. 6, the integrator 210 may include a current source 211, that provides a current ($gm^*(V_{REF}-V_{CS})$) based on a difference between a reference voltage ($V_{REF}$) and a sensing voltage ($V_{CS}$), a first switch 212, a capacitor 213, a bias 214 that is a voltage source connected in series with the current source 211 successively. One end of the bias 214 may be grounded.

An SR latch 216 may be connected to the first switch 212. The 'S' terminal of the SR latch 216 may receive an output signal of the off-time controller 230, and the 'R' terminal of the SR latch 216 may receive an output signal of the gate sensor 250. The 'Q' terminal of the SR latch 216 may apply an output signal to the first switch 212.

A second control switch 217 may be connected to opposite sides of the capacitor 213. The second switch 217 may be connected to receive an output signal of a switch control logic unit, and the switch control logic unit may include an inverting buffer 218.

Referring again to FIG. 5, the comparator 220 may compare an integrated signal that is integrated in the integrator 210 and a bias voltage. In the one or more examples, a bias voltage may have a form to be increased at a certain slope. In one or more examples, the comparator 220 may be embodied as an amplifier, and specifically, a differential amplifier. A bias voltage (Bias) may be applied to the '+' terminal of the comparator 220, and an integrated signal may be applied to the '-' terminal.

The off-time controller 230 may create a control signal to turn on the control switch 110 when a certain time has passed, starting from a point in time when the control switch 110 is turned off, and it may compose a current movement loop where a current may flow to the light-emitting devices 100 by an input power source, through the control switch 110. In other words, the off-time controller 230 may count a predetermined off time starting from the time when the control switch 110 is turned off, and an off time may be a time when the control switch 110 maintains a turned-off state, starting from a turn-off timing. A user may set the off time through a TOFF terminal. During a turn-off time, the off-time controller 230 may output a low level signal, and the off time controller 230 may output a high level signal when a turn-off time has passed. Likewise, a composition to control an off time is provided in a switch control circuit of a CCM mode.

The switch driver 240 may control the control switch 110 based on outputs of the comparator 220 and the off-time controller 230. In an example, the switch driver 240 may be embodied as an SR latch that performs a logic operation for outputs of the comparator 220 and the off-time controller 230. When it is embodied as an SR latch, an output of the off-time controller 230 and an output of the comparator 220 may be inputted respectively at input terminals 'S' and 'R' of the SR latch. When a high level signal (for example, 1) is input to the 'S' terminal of the SR latch, a 'SET' mode may be made, and a control signal to turn on the control switch 110 may be output through the '0' terminal. After that, when a high level signal (for example, 1 or a positive signal) is input according to an output of the comparator 220 at the 'R' terminal, the SR latch 240 may enter a 'RESET' mode, and it may output a control signal to turn off the control switch 110 through the 'Q' terminal.

In the switch control circuit of the one or more examples, the gate sensor 250 is further included. The gate sensor 250 may sense an input level state of a gate terminal and output a sensed gate sensing signal (GATE_S) to the integrator 210. The gate sensing signal (GATE_S) may be applied to the 'R' terminal of the SR latch 216 in the integrator 210. That is, the gate sensor 250 may sense a time when an input of a gate terminal becomes a low level, and a composition may be added to feed back a sensing result to the integrator 210. Consequently, when an input of a gate terminal becomes a high level, an integration operation of the integrator 210 may be started at a position lower than a bias voltage, and therefore, an error of a load current may be removed by controlling a VCS voltage not to be higher than a target voltage.

Figure 7:
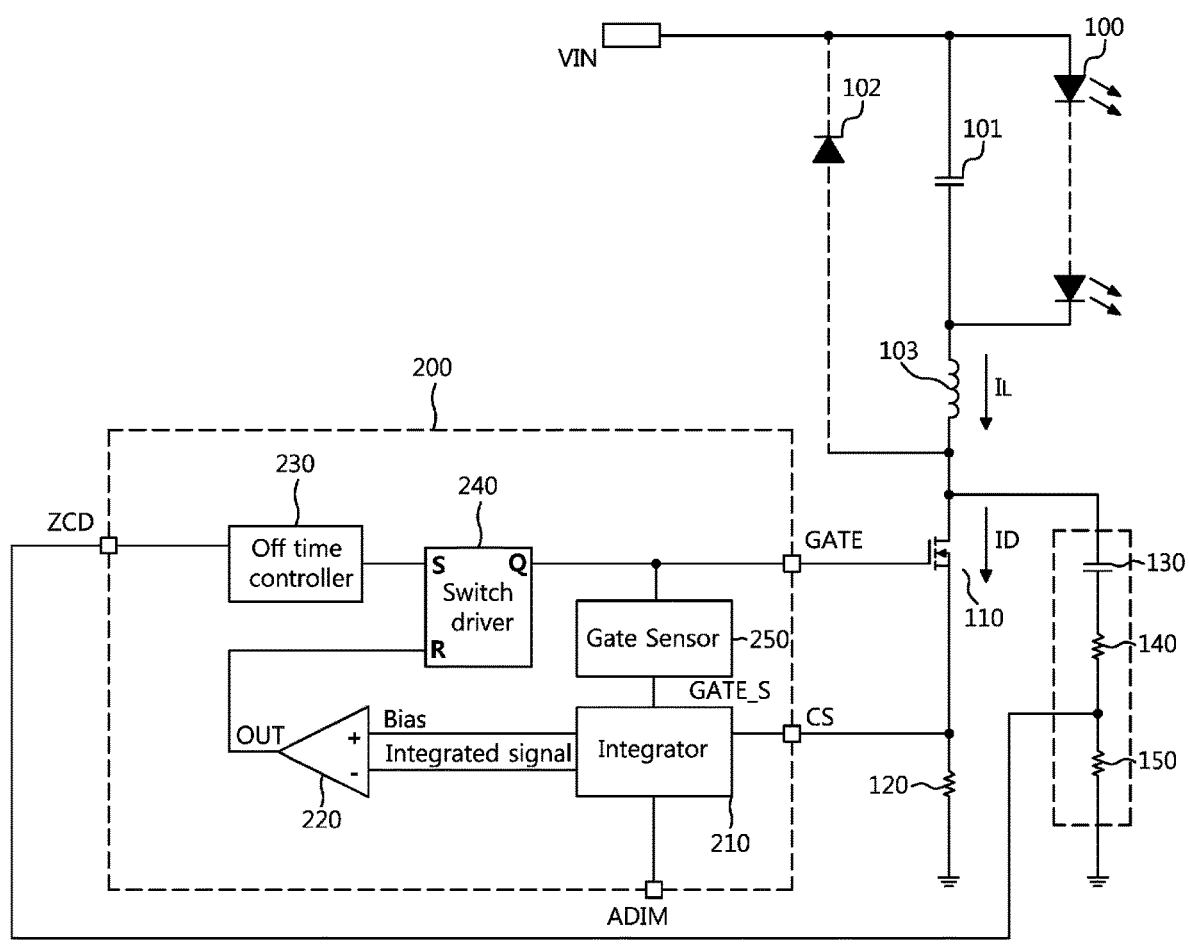
FIG. 7 illustrates a switch control circuit diagram that operates in a BCM mode, in accordance with one or more embodiments.

FIG. 7 illustrates a switch control circuit diagram that operates in a BCM mode, in accordance with one or more embodiments. Compared with the switch control circuit that operates in a CCM mode as illustrated in FIG. 5, the switch control circuit diagram as illustrated in FIG. 7 is a composition that senses a drain voltage of the control switch 110, and may include a capacitor 130, a first resistance 140, and a second resistance 150. Through these components, a timing to turn on the control switch may be adjusted by detecting a timing when a drain voltage becomes 0 and providing it to the off-time controller 230. Other components as illustrated in FIG. 7 may be the same as the components illustrated in FIG. 5.

In an example switch control circuit that operates in a BCM mode, the biggest difference is also the gate sensor 250 that senses an input level state of a gate terminal, compared with a typical circuit composition.

Next, an operation of a switch control circuit will be described with the operation timing diagrams of FIG. 8 and FIG. 9.

Figure 8:
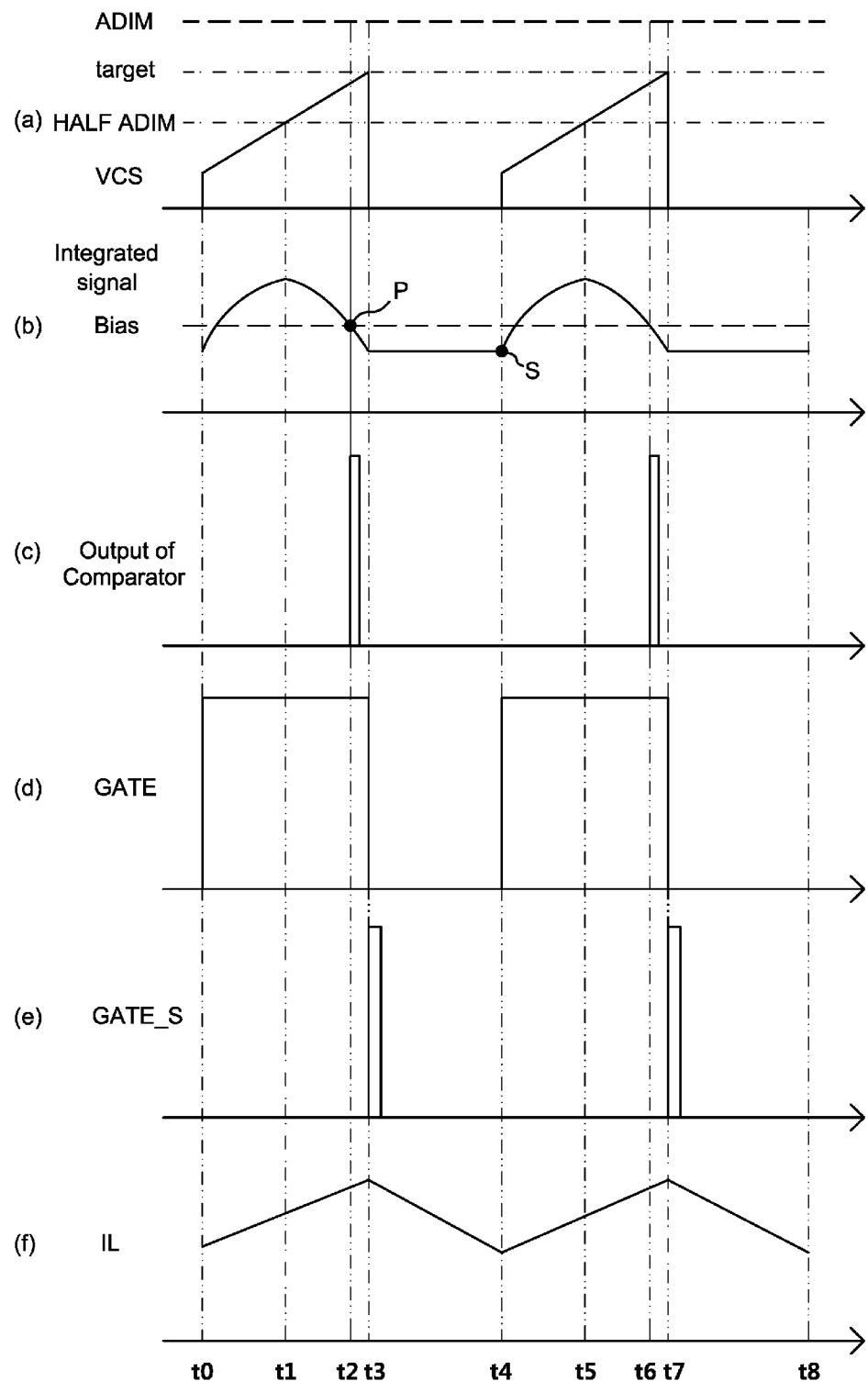
FIG. 8 illustrates an operation timing diagram of the circuit diagram of FIG. 5.
Figure 9:
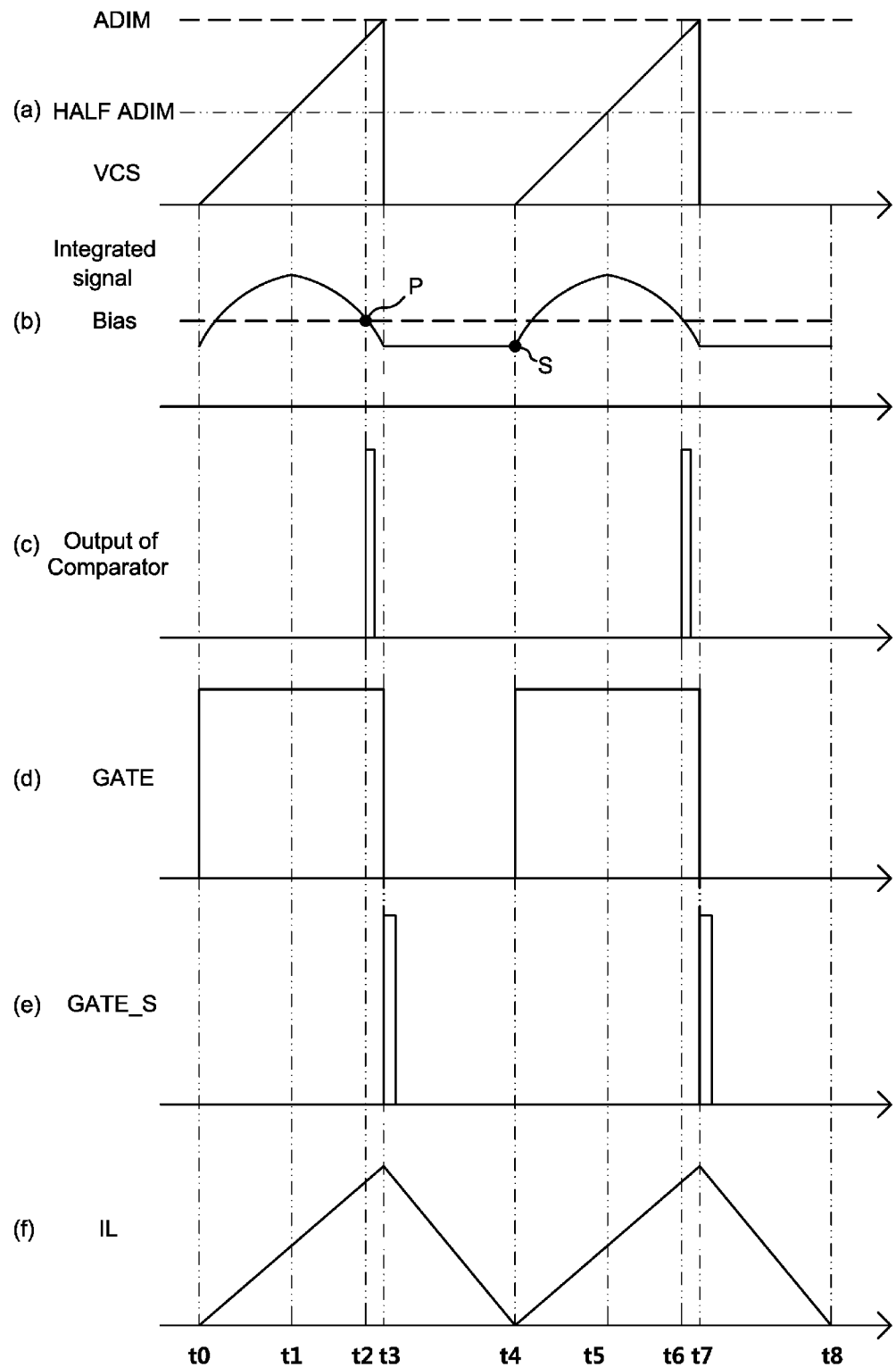
FIG. 9 illustrates an operation timing diagram of the circuit diagram of FIG. 7.

Referring to FIG. 8 and FIG. 9, the only difference is a starting point where a sensing voltage (VCS) and an inductor current (IL) are started, and other waves are all identical. Therefore, only FIG. 8 is described.

When an input of a gate terminal becomes a high level, the control switch 110 may be turned on, and an inductor current (IL) and a sensing voltage (VCS) may be increased. In the one or more examples, an integrated signal may be increased or decreased according to a sensing voltage (VCS) and a HALF ADIM voltage. Thus, an integrated signal may be increased in sections (t0~t1, t4~t5) where a sensing voltage (VCS) is lower than a HALF ADIM voltage. On the other hand, an integrated signal may be decreased in sections (t1~t3, t5~t7) where a sensing voltage (VCS) is higher than a HALF ADIM voltage.

The integrator 210 may output an integrated signal and a bias voltage in accordance with an integration operation to the comparator 220. Then, the comparator 220 may compare an integrated signal and a bias voltage continuously, and at a time (P) when an integrated signal becomes smaller than a bias voltage, the comparator 220 may output a high level signal (c). In an example, an integrated signal may keep decreasing. An integrated signal may be continuously decreased until an output of a comparator 220 is high, and an input of a gate terminal is a high level.

When the gate sensor 250 senses a timing that an input of a gate terminal becomes a low level, it may output a gate sensing signal (GATE_S) to the integrator 210. When the gate sensing signal (GATE_S) is output, an integration operation of the integrator 210 may be stopped, and a decrease of an integrated signal may be stopped. A stop of an integration operation may be maintained until an input of a gate terminal becomes a high level again (t3~t4, t7~t8).

Later, when an input of a gate terminal becomes a high level (t4, t8), an integrator 210 may start an integration operation again. An integration operation may be performed only during a time when the control switch 110 is turned on.

In an example of restarting an integration operation, a starting point of an integration operation may start increasing from a point where a voltage is lower than a bias voltage. It is 'S' of t4 in the drawing. Therefore, a sensing voltage (VCS) may not be increased more than an ADIM voltage (target). Thus, by decreasing an integrated signal by a time of a propagation delay from an output terminal of the comparator 220 to a gate terminal, an error of a load current may be compensated.

According to a switch control circuit and a switch control method of the one or more examples, in a switch control circuit that operates in a CCM mode or a BCM mode, an integrated signal may be decreased below a bias voltage, by as much as a time of a propagation delay that occurs between a comparator and a gate terminal, and an integrated signal may be started again in the decreased value.

Therefore, an error of a load current may be resolved that occurs because a gate-on time becomes longer by a propagation delay in a traditional switch control circuit.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A switch control circuit, comprising:
   a load, an inductor, a control switch, and a sensing resistance connected in series to an input power source;
   an integrator configured to integrate a sensing voltage (VCS) and a load current setting voltage (ADIM) to generate an integrated signal;
   a comparator configured to compare the integrated signal and a bias voltage (Bias);
   a switch driver configured to control the control switch based on an output of the comparator and an output of an off-time controller; and
   a gate sensor configured to output, to the integrator, a gate sensing signal that senses a time when an input of a gate terminal of the control switch becomes a low level,
   wherein an integration operation is started from a point in time when the integrated signal is lower than the bias voltage and when an input of the gate terminal becomes a high level.

2. The switch control circuit of claim 1, wherein the integrator comprises:
   a current source, configured to provide a current based on a difference between a reference voltage ($V_{REF}$) and the sensing voltage (VCS);
   a first switch, a capacitor, and a bias that is a voltage source, electrically connected to the current source;
   a logic element electrically connected to the first switch; and
   a second switch, connected on opposite sides of the capacitor, and configured to receive an output signal of a switch control logic unit.

3. The switch control circuit of claim 2, wherein the reference voltage ($V_{REF}$) is a half voltage of the load current setting voltage (ADIM).

4. The switch control circuit of claim 2, wherein the logic element is an SR latch, and
   wherein an 'S' terminal of the SR latch is configured to receive an output signal of the off-time controller, an 'R' terminal of the SR latch is configured to receive an output signal of the gate sensor, and a 'Q' terminal of the SR latch is configured to output an output signal to the first switch.

5. The switch control circuit of claim 2, wherein the switch control logic unit comprises an inverting buffer.

6. The switch control circuit of claim 1, wherein the integrated signal decreases until an input of the gate terminal becomes a low level, from a timing when the integrated signal is identical to the bias voltage, and
   wherein the decrease of the integrated signal is stopped when the gate sensor outputs the gate sensing signal to the integrator.

7. The switch control circuit of claim 6, wherein a decreased value of the integrated signal is lower than the bias voltage, and the integrated signal is maintained until an input of the gate terminal becomes a high level.

8. The switch control circuit of claim 1, wherein the integrated load current setting voltage is an integration of a half voltage of the load current setting voltage (HALF ADIM).

9. The switch control circuit of claim 1, wherein the switch control circuit is configured to operate in one of a Continuous Conduction Mode (CCM) and a Boundary Conduction Mode (BCM).

10. The switch control circuit of claim 9, wherein the switch control circuit that operates in the BCM mode is a Quasi-Resonant (QR) buck-converter.

11. The switch control circuit of claim 10, wherein the Quasi-Resonant buck-converter comprises a Zero-Current-Detect Circuit (ZCD Circuit) configured to detect a timing when an inductor current becomes 0.

12. The switch control circuit of claim 11, wherein the Zero-Current-Detect Circuit (ZCD Circuit) comprises one capacitor and two resistances which are connected in series.

13. A switch control method of a switch control circuit, the method comprising:
    comparing an integrated signal, that is an integration of a sensing voltage, and a bias voltage;
    decreasing the integrated signal to a value below the bias voltage in a decreasing section of the integrated signal;
    stopping the decrease of the integrated signal and maintaining the integrated signal for a predetermined time; and
    starting an integration operation of the sensing voltage when it is lower than the bias voltage and when an input of a gate terminal becomes a high level.

14. The method of claim 13, wherein the switch control circuit is configured to operate in one of a Continuous Conduction Mode (CCM mode) and a Boundary Conduction Mode (BCM mode).

15. The method of claim 13, wherein the integrated signal is decreased from a timing when an output of the comparing is a high level, until an input of the gate terminal becomes a low level.

16. The switch control method of claim 15, wherein the decrease of the integrated signal is stopped when a gate sensing signal is output to detect that an input of the gate terminal is a low level.

17. The switch control method of claim 16, wherein a decreased value of the integrated signal is maintained until an input of the gate terminal becomes a high level again.

18. A switch control circuit, comprising:
    a load, an inductor, a control switch, and a sensing resistance connected in series with an input power source; and
    a switch controller configured to control an operation of the control switch,
    wherein the switch controller comprises:
      an integrator configured to receive a current measured by the sensing resistance and a reference current, and generate an integrated signal;
      an amplifier configured to compare the integrated signal and a bias voltage;
      an off-time controller configured to create a control signal to turn on the control switch after a predetermined time period;
      an SR latch configured to control the control switch based on an output of the amplifier and an output of the off-time controller; and
      a gate sensor configured to transmit a gate sensing signal to the integrator.

19. The switch control circuit of claim 18, wherein the integrated signal is generated during a period when the control switch is turned on.

20. The control circuit of claim 18, wherein the gate sensor is further configured to:
   sense a time when an input of a gate terminal becomes a low level, and
   transmit a result of the sensing to the integrator.

\* \* \* \* \*